(12) United States Patent
Nada et al.

(10) Patent No.: US 12,727,440 B2
(45) Date of Patent: Sep. 1, 2026

(54) INSPECTION PATTERNS AND PATTERN EVALUATION METHOD

(71) Applicant: NTT, Inc., Tokyo (JP)

(72) Inventors: Masahiro Nada, Musashino (JP); Shoko Tatsumi, Musashino (JP); Yasuhiko Nakanishi, Musashino (JP)

(73) Assignee: NTT, Inc., Tokyo (JP)

( * ) Notice: Subject to any disclaimer, the term of this patent is extended or adjusted under 35 U.S.C. 154(b) by 344 days.

(21) Appl. No.: 18/693,400

(22) PCT Filed: Sep. 24, 2021

(86) PCT No.: PCT/JP2021/035090
§ 371 (c)(1),
(2) Date: Mar. 19, 2024

(87) PCT Pub. No.: WO2023/047533
PCT Pub. Date: Mar. 30, 2023

(65) Prior Publication Data

US 2025/0246485 A1 Jul. 31, 2025

(51) Int. Cl.
*H10P 74/20* (2026.01)
*H10P 72/00* (2026.01)
*H10P 74/00* (2026.01)

(52) U.S. Cl.
CPC ........ *H10P 74/203* (2026.01); *H10P 72/0604* (2026.01); *H10P 74/273* (2026.01)

(58) Field of Classification Search
CPC ..... H10P 74/20–207; H10P 74/23–238; H10P 74/27–277; H10P 74/203; H10P 72/0604; H10P 74/273; H10P 50/00; H10P 50/242; H10P 74/277; H10F 30/288; H10F 77/12–1285
See application file for complete search history.

(56) References Cited

U.S. PATENT DOCUMENTS 9,406,571 B2 * 8/2016 Yoshida ................ H10P 74/207
2022/0051953 A1 * 2/2022 Berding ............ H01J 37/32963

OTHER PUBLICATIONS

T. Shindo et al., *High Modulated Output Power Over 9.0 dBm with 1570-nm Wavelength SOA Assisted Extended Reach EADFB Laser (AXEL)*, IEEE Journal of Selected Topics in Quantum Electronics, vol. 23, No. 6, Nov./Dec. 2017, pp. 1-7.

(Continued)

*Primary Examiner* — Shahed Ahmed
(74) *Attorney, Agent, or Firm* — Workman Nydegger

(57) ABSTRACT

In the inspection pattern T for inspecting a processing state of a mesa (monitoring a fabrication accuracy against the expected pattern of a mesa) used for an actual element M, the actual element M includes a mesa formed by etching a substrate, and an electrode formed on the mesa, the inspection pattern T includes a mesa formed by etching the substrate, and a thin film that is formed at least on an upper surface of the inspection pattern portion T and has a thickness smaller than the thickness of the electrode, an etching state of the mesa is evaluated on the basis of a difference between the shape of the inspection pattern portion T and the shape of the thin film, and a lateral etching amount at the time of etching is quantitatively and accurately evaluated with a non-destructive inspection.

7 Claims, 13 Drawing Sheets

(56) References Cited

OTHER PUBLICATIONS

M. Nada et al., *Inverted InAlAs/InGaAs Avalanche Photodiode with Low-High-Low Electric Field Profile*, Japanese Journal of Applied Physics, vol. 51, 2012, pp. 1-5.
Y. Shiratori et al., *InGaP/GaAsSb/InGaAsSb/InP Double Heterojunction Bipolar Transistors with Record* $f_t$ *of 813 GHz*, IEEE Electron Device Letters, vol. 41, No. 5, May 2020, pp. 697-700.

* cited by examiner

IVb

VIb

VIb

205

203

200

201

(b)

205

204

203

203a

200

202

201

202a (a)
(b)
VIIb
303c
303b
303a
300
301
304
303ca
T1
T2
T3
304a
302
302a
M

IXb

305

300

301

IXb (b)

(a)
(b)
XIb
XIb
305
305
801
801
801
801
801
801
801
801
303b
303b
303a
303a
303c
300
300
301
301

XIIIb XIIIb 301 300 303a 303b 303c 305

(b)

301 302a 302 300 303a 304a 304 303b 304 303c 304 305

INSPECTION PATTERNS AND PATTERN EVALUATION METHOD

TECHNICAL FIELD

The present invention relates to an inspection patterns and a pattern evaluation method.

BACKGROUND ART

Compound semiconductor devices are used as light sources and photodetectors for various applications including optical communication. Moreover, a compound semiconductor optical device is used as a transistor constituting an integrated circuit that requires a high gain and high withstand voltage, and it is difficult to produce such a transistor by a known technology using silicon as a material. In many cases, a technique of dry etching or wet etching is used to produce a compound semiconductor device. Etching of a compound semiconductor is described in, for example, Non Patent Literature 1, Non Patent Literature 2, and Non Patent Literature 3.

Non Patent Literature 1 discloses forming a semiconductor optical waveguide by dry etching in producing a semiconductor laser used for various light sources. Non Patent Literature 2 discloses that mesa processing by dry etching or wet etching is required to produce a photodiode used for a photodetector. Non Patent Literature 3 discloses processing a collector and a base into desired sizes by etching, and providing an electrode at an upper portion of the collector and the base in producing a hetero-bipolar transistor.

CITATION LIST

Non Patent Literature

Non Patent Literature 1: T. Shindo et al (2017), High Modulated Output Power Over 9.0 dBm With 1570-nm Wavelength SOA Assisted Extended Reach EADFB Laser (AXEL) IEEE J. Sel. Topics Quantum Electron., 23, NO. 6, NOVEMBER/DECEMBER 1500607.

Non Patent Literature 2: M. Nada et al (2012), Inverted InAlAs/InGaAs Avalanche Photodiode with Low-High-Low Electric Field Profile Jpn. J. Appl. Phys., 51, 02BG03.

Non Patent Literature 3: Y. Shiratori et al (2020), InGaP/GaAsSb/InGaAsSb/InP Double Heterojunction Bipolar Transistors With Record ft of 813 GHz IEEE Electron Device Lett., 41, No 5, MAY.

SUMMARY OF INVENTION

Technical Problem

The accuracy of the etching processing in the above-described field is extremely important for each device to obtain desired characteristics in any case. For example, in an optical waveguide of a semiconductor laser, a variation in the width of the waveguide affects a propagating beam characteristic, and may lead to excessive optical loss. Furthermore, it is known that, in the case of a photodiode, the processing accuracy of a mesa affects parasitic capacitance and dark current of an element, and in the case of a hetero-bipolar transistor, the processing accuracy of a collector or the like affects parasitic capacitance.

As a cause of lowering of etching accuracy, a phenomenon is known in which etching proceeds also in the lateral direction in the process of etching at a desired depth. Such etching is called lateral etching or side etching, and will be hereinafter referred to as lateral etching in the present specification. In many cases, the amount of lateral etching (lateral etching amount) is managed for each step of etching. As a method of managing the lateral etching amount, for example, it is conceivable to measure the lateral etching amount by performing etching in advance under conditions similar to the etching conditions for semiconductor chip production, prior to semiconductor chip production. Moreover, for example, it is conceivable to extract a semiconductor chip in mass production after the etching step and measure the lateral etching amount. Furthermore, the measurement of the lateral etching amount can be realized by exposing a cross section of the semiconductor chip by focused ion beam (FIB) processing and observing the cross section with an electron microscope.

However, the lateral etching amount varies depending on a slight difference in a condition (temperature, flow rate of etching gas or etchant, or the like) that varies for each etching, or a subtle difference in the crystal composition ratio of the element. Therefore, the lateral etching amount at the time of etching performed in advance does not necessarily coincide with the lateral etching at the time of mass production. Moreover, since the cross-section observation is a destructive inspection, it is difficult to apply the cross-section observation to each wafer in mass production.

In addition to the above, the lateral etching amount can also be measured by observation from the upper surface of the wafer with an optical microscope or the like. However, in an element that can be mass-produced and actually operated (which will be hereinafter referred to as "actual element"), an electrode or various passivation films are formed on an upper surface thereof, and the state of a pattern below the electrode or the like cannot be observed from above the electrode or the like in some cases.

FIG. 1 is a view for explaining a problem in observation from an upper surface of a wafer, and illustrates an actual pattern portion 102 formed by etching a substrate (wafer) 100, and an insulating film D formed on the actual pattern portion 102. Such an example is an example of a mesa transistor, and the actual pattern portion 102 corresponds to a mesa part of the mesa transistor. Two-dot chain lines A drawn in FIG. 1 indicate an ideal mesa shape, and the actual pattern portion 102 actually obtained is formed thinner than an ideal mesa shape by lateral etching.

As illustrated in FIG. 1, in a case where the lateral etching of the substrate 100 proceeds to an area below the insulating film D, it is difficult to accurately measure the lateral etching amount of the actual pattern portion 102 by observation from the upper surface. Moreover, even if the lateral etching of the actual pattern portion 102 does not proceed to the lower layer of the insulating film D, in a case where the film thickness of the insulating film D is large, it is difficult for the optical microscope or the electron microscope to simultaneously focus on both the end of the insulating film D and the end of the actual pattern portion 102 together, and it is difficult to quantify the lateral etching amount. That is, although etching of a semiconductor is an extremely important step of determining characteristics of a semiconductor element and it is desirable that the amount of lateral etching associated with etching is managed with high accuracy, it is difficult with conventional technique to evaluate and manage the amount of lateral etching with an actual element in each semiconductor process.

The present disclosure has been made in view of the above points, and relates to an inspection patterns and a pattern evaluation method that make it possible to quantitatively and accurately measure the lateral etching amount at the time of etching with a non-destructive inspection.

Solution to Problem

In order to achieve the above object, an inspection pattern according to an aspect of the present disclosure is an inspection pattern for inspecting a processing state of a pattern used for an actual element, in which the actual element includes an actual pattern portion formed by etching a substrate, and an actual upper layer portion formed on the actual pattern portion, the inspection pattern includes: an inspection pattern portion formed by etching the substrate; and an inspection layer portion that is formed at least on the inspection pattern portion and has a thickness smaller than a thickness of the actual upper layer portion, and an etching state of the actual pattern portion is evaluated on the basis of a difference between the shape of the inspection pattern portion and the shape of the inspection layer portion.

A pattern evaluation method according to an aspect of the present disclosure is a pattern evaluation method for evaluating a processing state of an actual element including an actual pattern portion formed by etching a substrate, and an actual upper layer portion formed on the actual pattern portion, the method including: a step of manufacturing an inspection pattern including an inspection pattern portion formed by etching the substrate and an inspection layer portion that is formed at least on the inspection pattern portion and has a thickness smaller than a thickness of the actual upper layer portion; and a step of observing the inspection pattern portion and the inspection layer portion from a side of the inspection layer portion, and evaluating an etching state of the actual pattern portion on the basis of a difference between the shape of the inspection pattern portion and the shape of the inspection layer portion.

Advantageous Effects of Invention

According to the above embodiment, it is possible to provide an inspection pattern and a pattern evaluation method that make it possible to quantitatively and accurately measure the lateral etching amount at the time of etching with a non-destructive inspection.

BRIEF DESCRIPTION OF DRAWINGS

FIG. 2(*a*) is a top view for explaining an inspection pattern according to a first embodiment, and FIG. 2(*b*) is a cross-sectional view.

FIG. 3(*a*) is a top view for explaining a method of manufacturing an inspection pattern according to the first embodiment, and FIG. 3(*b*) is a cross-sectional view.

FIG. 4(*a*) is a top view for explaining the method of manufacturing an inspection pattern according to the first embodiment subsequent to FIG. 3(*a*), and FIG. 4(*b*) is a cross-sectional view subsequent to FIG. 3(*b*).

FIG. 5(*a*) is a top view for explaining the method of manufacturing an inspection pattern according to the first embodiment subsequent to FIG. 4(*a*), and FIG. 5(*b*) is a cross-sectional view subsequent to FIG. 4(*b*).

FIG. 6(*a*) is a top view for explaining the method of manufacturing an inspection pattern according to the first embodiment subsequent to FIG. 5(*a*), and FIG. 6(*b*) is a cross-sectional view subsequent to FIG. 5(*b*).

FIG. 8 is a top view for explaining thin films according to the second embodiment having different diameters.

FIG. 9(*a*) is a top view for explaining a method of manufacturing an inspection pattern according to the second embodiment, and FIG. 9(*b*) is a cross-sectional view.

FIG. 10(*a*) is a top view for explaining the method of manufacturing an inspection pattern according to the second embodiment subsequent to FIG. 9(*a*), and FIG. 10(*b*) is a cross-sectional view subsequent to FIG. 9(*b*).

FIG. 12(*a*) is a top view for explaining the method of manufacturing an inspection pattern according to the second embodiment subsequent to FIG. 11(*a*), and FIG. 12(*b*) is a cross-sectional view subsequent to FIG. 11(*b*).

FIG. 13(*a*) is a top view for explaining the method of manufacturing an inspection pattern according to the second embodiment subsequent to FIG. 12(*a*), and FIG. 13(*b*) is a cross-sectional view subsequent to FIG. 12(*b*).

DESCRIPTION OF EMBODIMENTS

Figure 1:
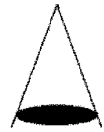
FIG. 1 is a view for explaining a problem in observation from an upper surface of a wafer.
Figure 1:
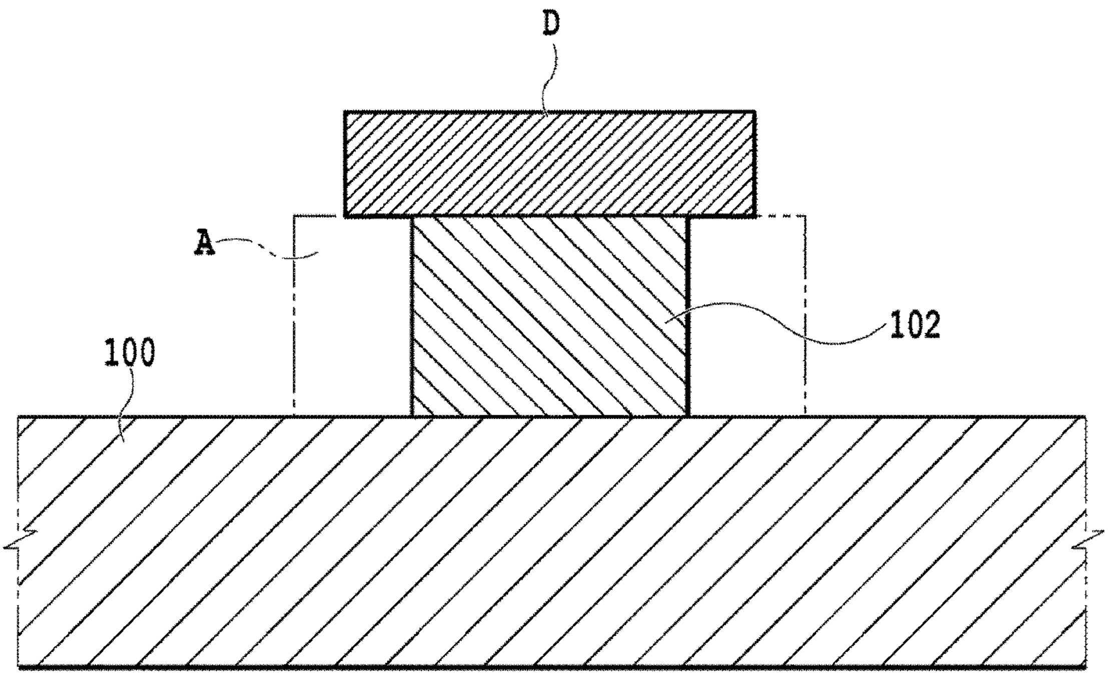

Hereinafter, a first embodiment and a second embodiment of the present disclosure will be described. In the present specification, the first embodiment and the second embodiment are also collectively referred to as "the present embodiment". Moreover, the drawings used for explaining the present embodiment are for the purpose of describing the technical idea, shape, and arrangement of constituent components of the present disclosure, and therefore do not limit the specific shape or configuration of the present disclosure, and do not necessarily accurately represent the balance or aspect ratio of each constituent component.

First Embodiment

Figure 2:
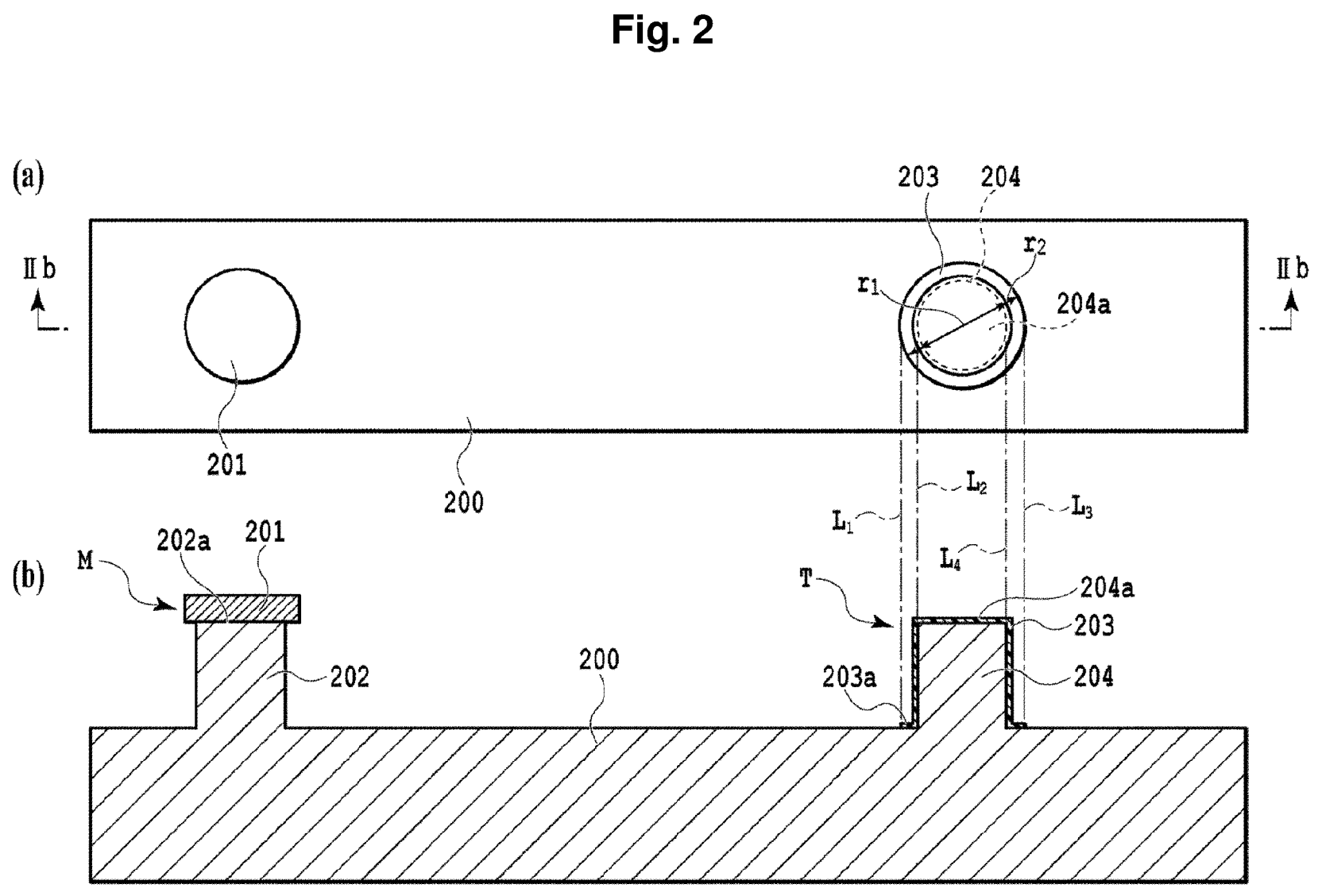

FIG. 2(*a*) and FIG. 2(*b*) are figures for explaining an inspection pattern of the first embodiment, in which FIG. 2(*a*) is a top view for explaining an inspection pattern T on a semiconductor chip, and FIG. 2(*b*) is a cross-sectional view taken along arrows IIb and IIb drawn in FIG. 2(*a*). Such a first embodiment will be described by using an element having a mesa as an example among photodiodes produced from a compound semiconductor. Moreover, FIG. 2(*a*) and FIG. 2(*b*) illustrate a state in a manufacturing step of a semiconductor chip, and no upper wiring layer nor insulating layer is further formed.

As illustrated in FIG. 2(*a*) and FIG. 2(*b*), a substrate 200 in the manufacturing step includes both an actual element M, which is a photodiode, and the inspection pattern T. The actual element M includes a mesa 202, which is an actual pattern portion formed by etching the substrate 200, and an electrode 201, which is an actual upper layer portion. The inspection pattern T includes a mesa 204, which is an inspection pattern portion, and a thin film 203, which is an inspection layer. In the following description regarding the present embodiment, a direction from the substrate 200 toward where the mesas 202 and 204 are formed is referred to as "upper" or "above" of the chip, and a direction from the mesas 202 and 204 toward the substrate 200 is referred to as "lower" or "below". The inspection pattern T is used to evaluate the etching state of the mesa 202 on the basis of a difference between the shape of the mesa 204 and the shape of the thin film 203.

The electrode 201 is formed on the mesa 202 and is used to supply electric power to the mesa. The thin film 203 is a layer that is formed at least on the mesa 204 and has a thickness smaller than the thickness of the electrode 201. At this time, the substrate 200 is in a state of a wafer before dicing.

In the first embodiment, both the mesas 202 and 204 have cylindrical shapes. The electrode 201 is made of Au. The thin film 203 is an insulating film including a film of an inorganic material, and may be a film including, for example, SiN, $SiO_2$, SiON, or at least one of these. The thin film 203 of the first embodiment covers the surface including the upper portion of the mesa 204 and a part of the substrate 200 around the mesa 204. An outer edge of a peripheral portion 203*a* of the thin film formed on the substrate 200 is indicated by straight lines $L_1$ and $L_2$ in FIG. 2(*a*) and FIG. 2(*b*). Moreover, an outer edge of the upper surface of the mesa 204 is indicated by straight lines $L_2$ and $L_4$. The lateral etching amount of the mesa 202 of the actual element M cannot be observed from above because of the electrode 201. On the other hand, when observed from above, the mesa 204 of the inspection pattern T appears to overlap with the thin film 203 as illustrated in FIG. 2(*a*). All that is required is that the thin film 203 is a film so thin and transparent that the upper surface of the mesa 204 is observable, and it is preferable that the thickness is, for example, approximately 0.02 μm to 0.2 μm. In such an inspection pattern T, it is possible to focus on both the edge portion of an upper surface 204*a* and the edge portion of the peripheral portion 203*a* in observation from above, and thus, it is possible to visually recognize the state of the shapes (difference in diameter) of both the portions clearly.

The shape of the mesa 204 in the first embodiment refers to a diameter $r_1$ of the upper surface 204*a* of the cylindrical mesa 204. The lateral etching amount of the mesa 204 can be obtained by observing the upper surface 204*a* from above without destroying the chip, accurately measuring the diameter $r_1$ thereof, and comparing the diameter $r_1$ with a designed value of the diameter of an upper surface 202*a* of the actual element M. Then, the lateral etching amount of the mesa 204 is treated as the amount of lateral etching of the mesa 202 occurring below the electrode 201, or the amount of lateral etching of the mesa 202 under the electrode 201 can be estimated on the basis of the lateral etching amount of the mesa 204.

That is, the etching of the mesas 202 and 204 is simultaneously performed as will be described in detail later. Therefore, conditions of the etching of the mesas 202 and 204 such as the flow rate of the etching gas, discharge, and the state in the etching chamber are the same. Moreover, since the mesas 202 and 204 are formed on the same substrate 200, conditions such as the composition of the wafer are also the same. Furthermore, in the first embodiment, the mesas 202 and 204 are formed in an area in which the etching state does not change depending on the position of the wafer. Accordingly, the amount of lateral etching occurring in the mesa 204 can be regarded as the same as the amount of lateral etching occurring in the mesa 202.

Furthermore, in the first embodiment, the thin film 203 including the peripheral portion 203*a* has a shape based on a designed value of the mesa 202. The shape of the thin film 203 in the present embodiment refers to a diameter $r_2$ of the peripheral portion 203*a*, and the diameter $r_2$ of the peripheral portion 203*a* of the first embodiment is equal to the designed value of the diameter of the mesa 202. In this way, the inspector can observe the inspection pattern T from above, measure the distance between the straight lines $L_1$ and $L_2$ or between the straight lines $L_3$ and $L_4$, and immediately evaluate the lateral etching amount. At this time, according to the inspection pattern T, the diameter $r_1$ of the upper surface 204*a* of the mesa 204 can be visually recognized clearly with reference to the diameter $r_2$ of the edge portion of the peripheral portion 203*a*, and the lateral etching amount can be easily measured and intuitively grasped as illustrated in FIG. 2(*a*). Here, note that the "evaluation" refers to the magnitude of the difference between the dimensional shape of the produced actual pattern M and the designed value, and the smaller the difference, the higher the evaluation. Moreover, in the first embodiment, a threshold may be set for the difference, and when the difference is equal to or less than the threshold, the actual element may be evaluated so as to allow a difference from the designed value.

As described above, according to the first embodiment, the lateral etching amount of the actual element M that is difficult to measure in a non-destructive manner can be quantified by observing the inspection pattern T from above. Furthermore, if the outer edge of the peripheral portion 203*a* is designed to match the outer edge of an ideal mesa, measurement can be facilitated, and the degree of lateral etching can be instinctively recognized easily. Accordingly, the first embodiment can provide an inspection pattern that makes it possible to quantitatively and accurately evaluate the lateral etching amount at the time of etching with a non-destructive inspection.

Furthermore, the first embodiment does not limit the shapes of the mesas 202 and 204 to cylindrical shapes. For example, the mesas 202 and 204 may each have a prismatic shape with a quadrangular upper surface, and even in such a case, the lateral etching amount can be determined by measuring the size of the quadrangular upper surface. Furthermore, in the first embodiment, not only the lateral etching but also the degree of over-etching can be determined by, for example, the shape of the corner portion of the quadrangular upper surface (rounding or the like of the corner portion). Furthermore, the first embodiment can be applied to observing a cylindrical or prismatic inspection pattern from the upper surface and determining the presence or absence of taper etching by the length of the interval between the upper surface and the peripheral portion.

Figure 3:
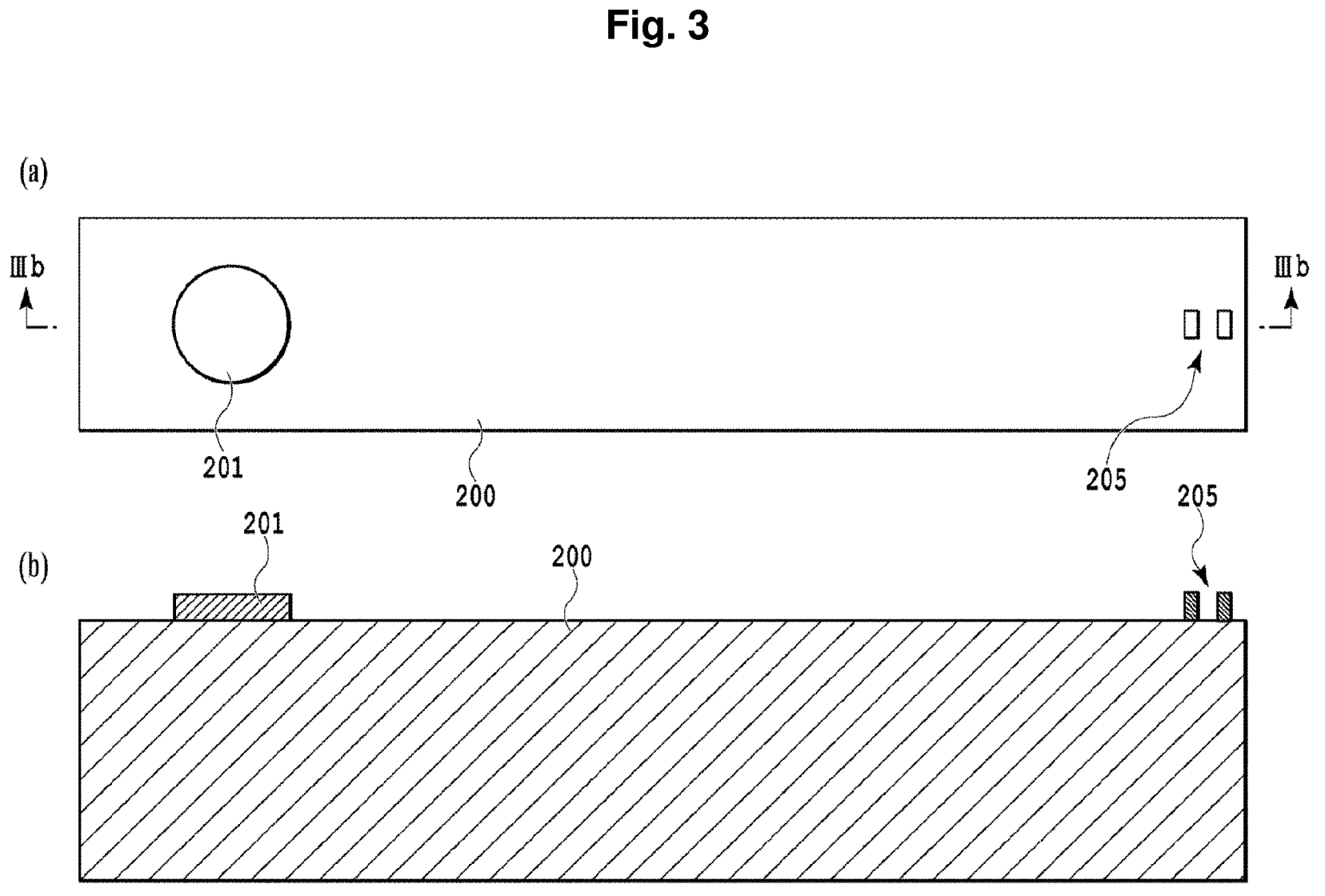

Next, a method of manufacturing an inspection pattern according to the first embodiment will be described. FIG. 3(*a*) to FIG. 6(*b*) are views for explaining a method of manufacturing the inspection pattern T of the first embodiment. Among these, FIG. 3(*a*), FIG. 4(*a*), FIG. 5(*a*), and FIG. 6(*a*) are schematic top views of a chip being manufactured, and FIG. 3(*b*), FIG. 4(*b*), FIG. 5(*b*), and FIG. 6(*b*) are cross-sectional views each taken along a cutting-plane line of a corresponding top view. In manufacturing the inspection pattern, first, the Au electrode 201 and an alignment mark 205 are formed on the substrate 200 in a wafer state as illustrated in FIG. 3(*a*) and FIG. 3(*b*). Note that the alignment mark 205 is used for alignment with the position of the inspection pattern when exposure is performed a plurality of times in subsequent steps. The substrate 200 of the first embodiment is a semiconductor epitaxial substrate. The electrode 201 is formed by, for example, a known method. This method may be, for example, a method in which a resist is applied to the surface of the substrate 200, a mask is produced by photolithography, the electrode 201 is formed on the mask by, for example, electron beam deposition, and then lift-off is performed. The alignment mark 205 can be formed by, for example, depositing an Au member by electron beam deposition with an alignment mark production pattern placed in a mask.

Next, in the first embodiment, a resist mask (not shown) is formed on the electrode 201 with reference to the alignment mark 205. At this time, a resist mask having the same material and sizing is also formed at a position where the inspection pattern is to be formed. Then, the substrate 200 in a wafer state is etched by, for example, a wet method using the resist mask, so that the mesas 202 and 204 illustrated in FIG. 4(*a*) and FIG. 4(*b*) are formed. The etching for forming the mesa 204 is performed simultaneously with the etching of the mesa 202. The mesa 204 is formed by etching a position different from the position where the electrode 201 is formed. However, the formation position of the mesa 204 is in an area where the conditions are considered to be the same as the etching of the mesa 202 on the wafer.

Figure 4:
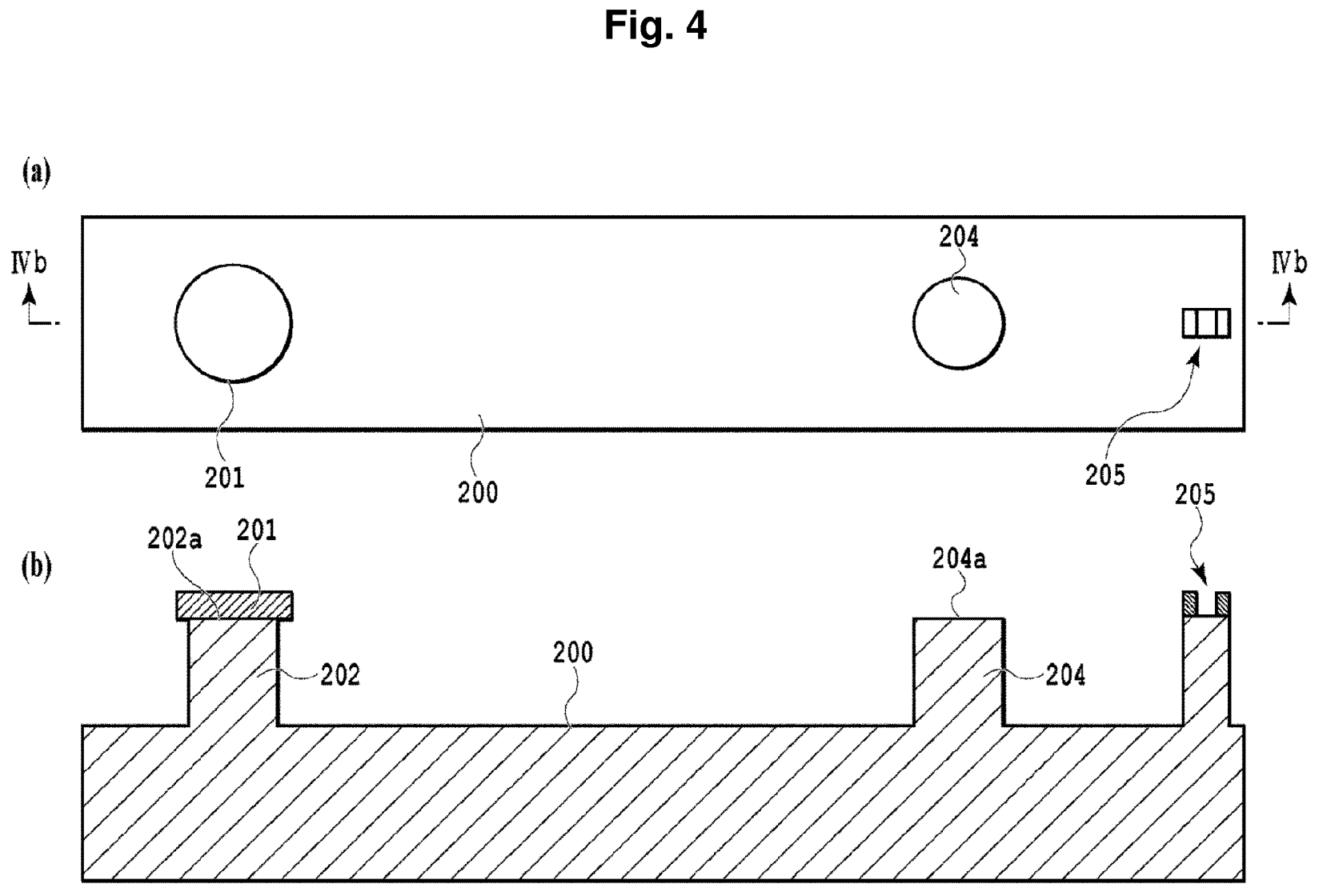

The mesa 202 in the state illustrated in FIG. 4(*b*) is formed immediately below the electrode 201, and the mesa 204 has an upper surface 204*a* exposed on the substrate 200. Moreover, lateral etching occurs at the time of etching when the mesas 202 and 204 are formed. By the lateral etching, the mesa 202 becomes smaller in diameter than the electrode 201 as illustrated in FIG. 4(*b*), and the edge portion thereof is positioned below the electrode 201 and cannot be observed from above. On the other hand, the upper surface 204*a* of the mesa 204 is exposed after the resist layer is peeled off, and the edge portion of the upper surface becomes observable from above. Furthermore, in order to observe the amount of lateral etching of the mesa 204 illustrated in FIG. 4(*b*), it is necessary to measure the diameter of the upper surface 204*a* and subtract the measured diameter from an ideal value (designed value). In the first embodiment, the thin film 203 is formed on the mesa 204 so that the upper surface 204*a* of the mesa 204 can be observed from above and the degree of lateral etching can be immediately grasped.

Figure 5:
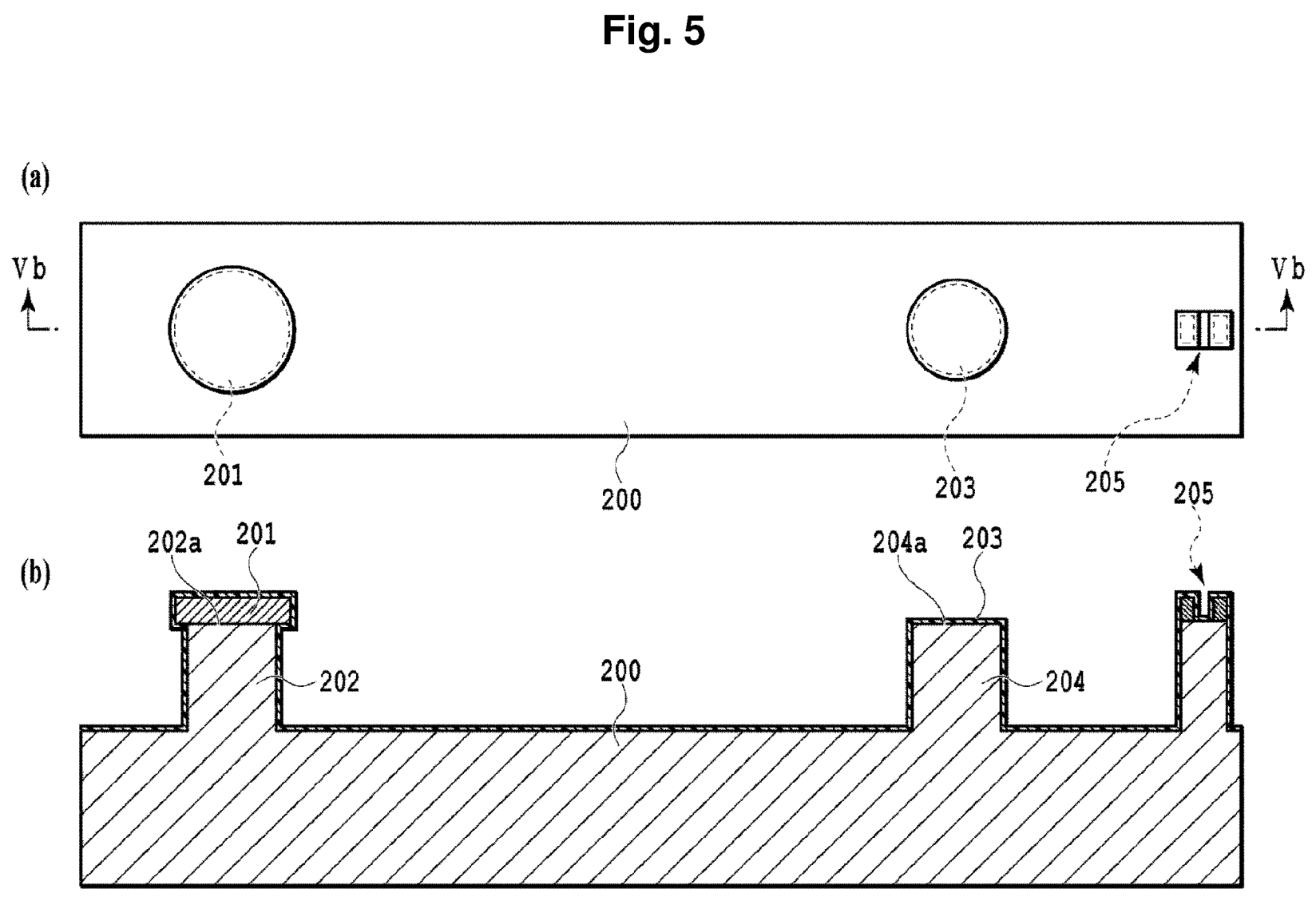
Figure 6:
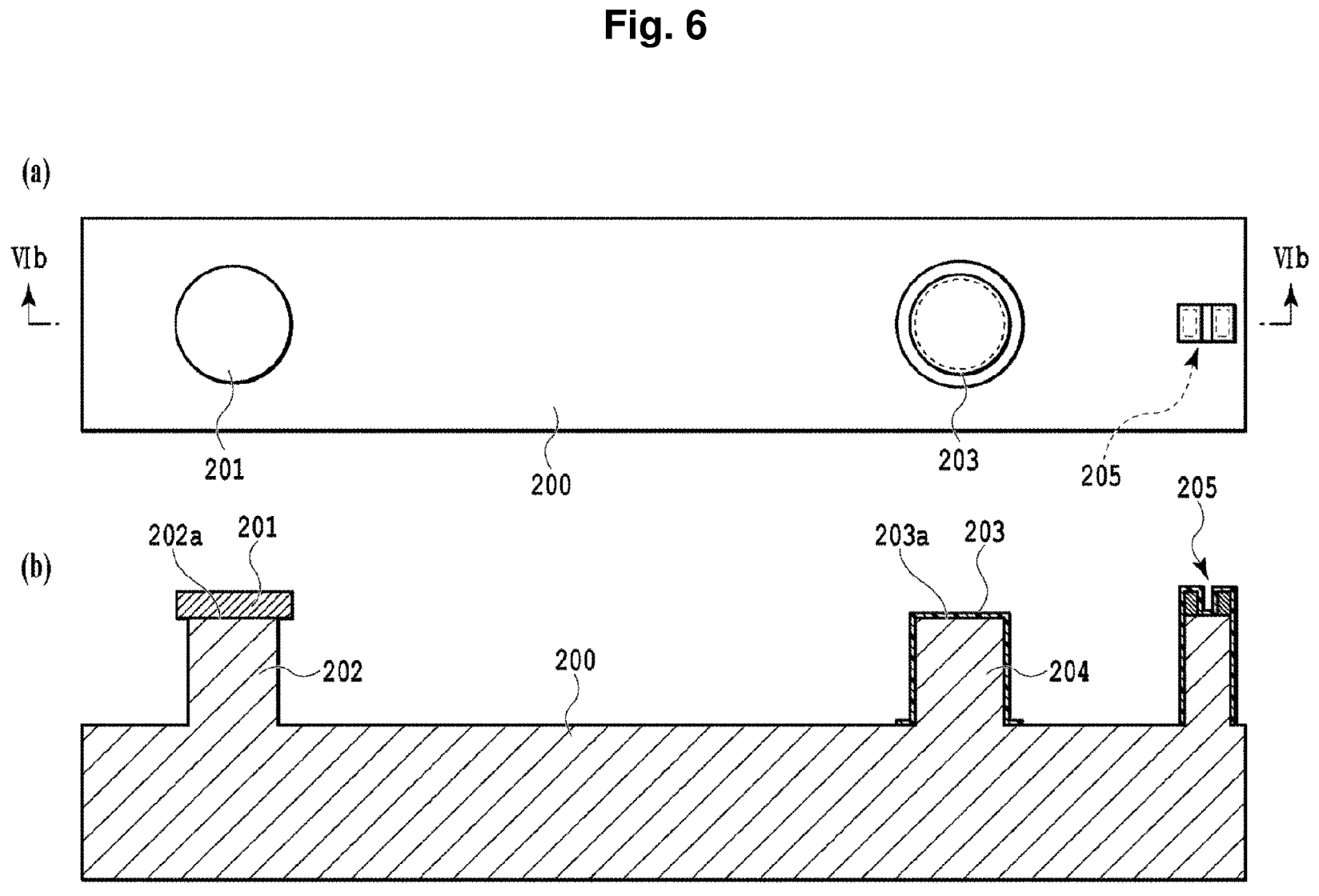

Next, formation of the thin film 203 will be described with reference to FIG. 5(*a*) to FIG. 6(*b*). In the first embodiment, the thin film 203 is formed on the entire surface of the substrate 200 as illustrated in FIG. 5(*a*) and FIG. 5(*b*). The thin film 203 of the first embodiment is, for example, a 20 nm SiN film formed by plasma chemical vapor deposition (CVD). Then, in the first embodiment, a resist mask (not shown) is formed on the upper surface 202*a* of the mesa 202 from above the thin film 203, and the thin film 203 excluding a part covered by the resist mask is dry-etched, for example. At this time, in the first embodiment, the diameter of the resist mask is adjusted to coincide with an ideal diameter of the mesa 202. Since lateral etching occurs in the mesa 204 at the time of etching of the thin film 203, in a case where etching is performed using a resist mask that coincides with an ideal diameter of the mesa 202, a thin film to be the peripheral portion 203*a* remains on the substrate 200 around the mesa 204 as well as the surface of the mesa 204 as illustrated in FIG. 5(*b*).

Moreover, lateral etching may occur at the time of etching of the thin film 203 as with the time of forming the mesas 202 and 204. However, as described above, the thickness of the thin film 203 is as extremely thin as 20 nm, and the etching time is sufficiently shorter than the etching time of the mesa. Therefore, the amount of lateral etching generated in the thin film is negligible, and it can be considered that the outer edge of the peripheral portion 203*a* coincides with an ideal diameter of the mesa 202. Note that the thickness of the thin film 203 is required to be thinner than the thickness of the electrode 201, since the mesa 204 of the actual element M needs to be visible from above when the mesa 202 cannot be visually recognized from above. However, the thickness of the thin film 203 is appropriately determined according to the light transmittance of the material, the etching rate, and the like.

The evaluation of the mesa 202 using the inspection pattern T of the first embodiment described above is performed in a state where the mesa 204 and the thin film 203 are exposed in the manufacturing step of the semiconductor chip. Note that the state in which the mesa 204 and the thin film 203 are exposed refers to, for example, a state in which no layer is formed on at least the upper layer of the inspection pattern T.

Second Embodiment

Figure 7:
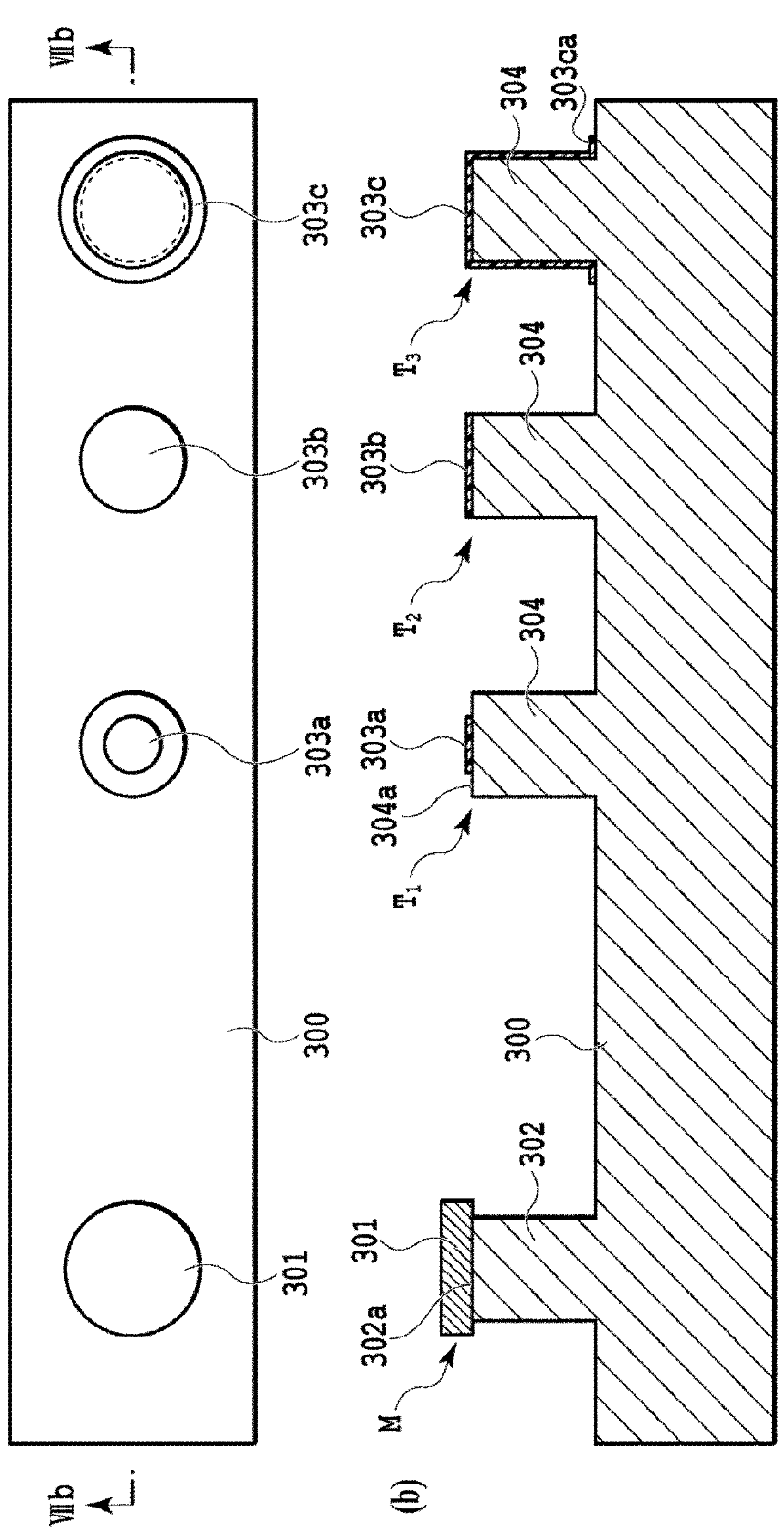
FIG. 7(*a*) is a top view for explaining an inspection pattern according to a second embodiment, and FIG. 7(*b*) is a cross-sectional view.

Next, a second embodiment of the present disclosure will be described. FIG. 7(*a*) and FIG. 7(*b*) are views for explaining an inspection pattern of the second embodiment, in which FIG. 7(*a*) is a top view, and FIG. 7(*b*) is a cross-sectional view taken along arrows VIIb and VIIb drawn in FIG. 7(*a*). A plurality of inspection patterns $T_1$, $T_2$, and $T_3$ of the second embodiment are provided around chips that are the same as an actual element M, and at least some of the plurality of inspection patterns $T_1$, $T_2$, and $T_3$ respectively include similar thin films 303*a*, 303*b*, and 303*c* having the same shapes and different sizes. As with the first embodiment, the inspection patterns $T_1$, $T_2$, and $T_3$ of the second embodiment each include a mesa 304 formed by etching an amorphous substrate 300, and any of the thin films 303*a*, 303*b*, and 303*c* formed on an upper surface 304*a* of a mesa 304. Moreover, as with the first embodiment, the actual element M includes a mesa 302 formed by etching the substrate 300, and an electrode 301 formed on an upper surface 302*a* of the mesa 302.

As is clear from FIG. 7(*a*) and FIG. 7(*b*), among the thin films 303*a*, 303*b*, and 303*c*, the diameter of the thin film 303*a* is smaller than the diameter of the upper surface 304*a*, the diameter of the thin film 303*b* coincides with the diameter of the upper surface 304*a*, and the diameter of the thin film 303*c* including a peripheral portion 303*ca* in a top view is larger than the diameter of the upper surface 304*a*. Moreover, the diameters of the upper surfaces 304*a* of the three inspection patterns $T_1$, $T_2$, and $T_3$ are all the same.

Figure 8:
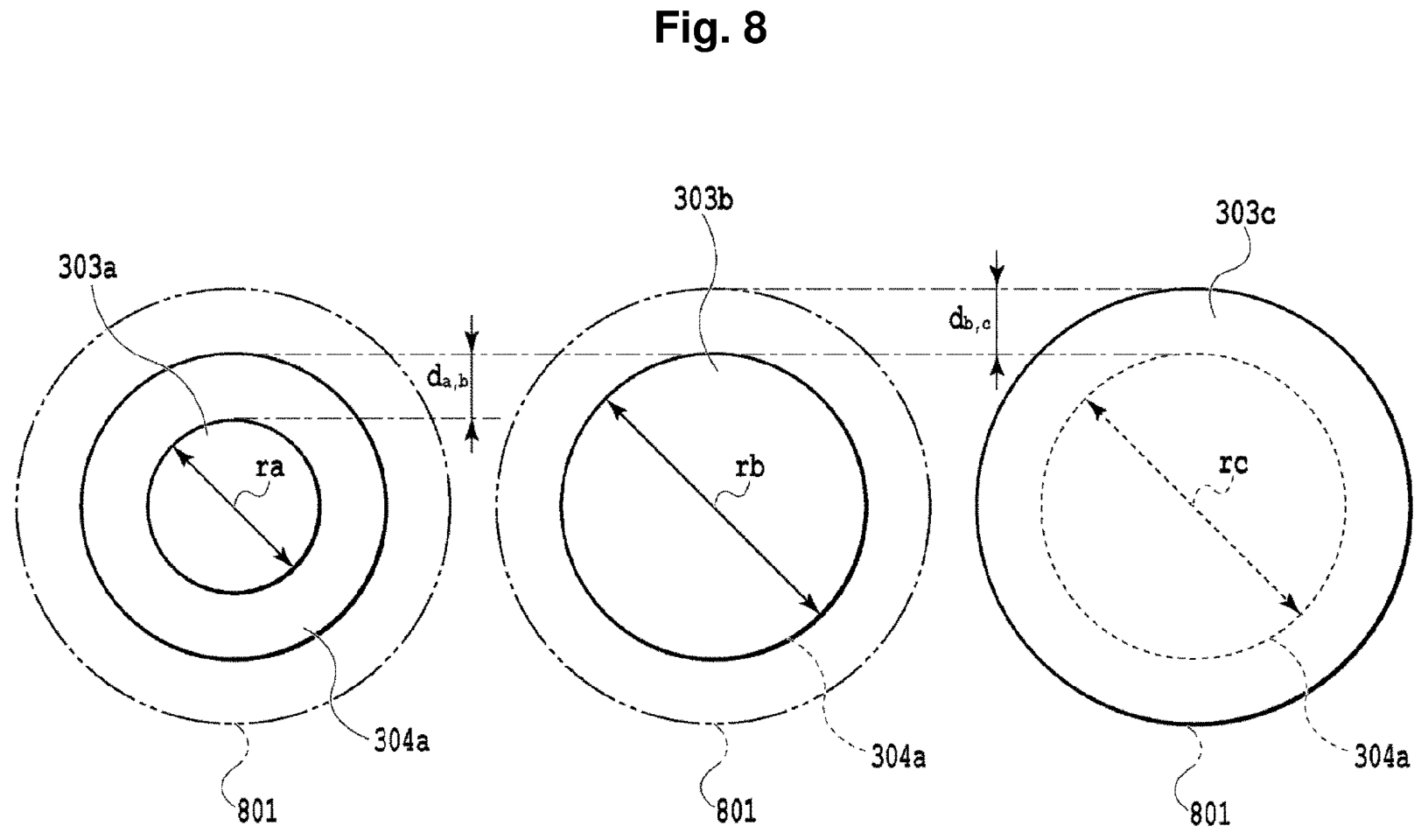

FIG. 8 is a top view for explaining the thin films 303*a*, 303*b*, and 303*c*. The diameters of the thin films 303*a*, 303*b*, and 303*c* increase by 0.2 um in this order. That is, as illustrated in FIG. 8, the distances $d_{a,b}$ and $d_{b,c}$ are each 0.1 μm. Moreover, in FIG. 8, the outer edge of the resist masks 801 used for etching for forming the mesa 304 is indicated by broken lines. The resist masks 801 each have a circular shape in a top view, and all diameters thereof are the same. A diameter ra of the thin film 303*a* is smaller than the diameter of the resist mask 801 by 0.2 μm, a diameter rb of the thin film 303*b* is smaller than the diameter of the resist mask 801 by 0.1 μm, and a diameter rc of the thin film 303*c* is designed to coincide with the diameter of the resist mask 801. According to the inspection pattern $T_3$ in the state illustrated in FIG. 8, since the diameter of the upper surface 304*a* is smaller than the diameter rc of the thin film 303*c*, it can be seen that lateral etching occurs at the time of forming the mesa 304, and the diameter of the mesa 304 is smaller than the diameter of the resist mask 801. Moreover, according to the inspection pattern $T_1$, since an upper surface 304*a* is larger than the diameter ra of the thin film 303*a*, it can be seen that the lateral etching amount is 0.2 μm or less. Furthermore, according to the inspection pattern $T_2$, since an upper surface 304*a* coincides with the diameter rb of the thin film 303*a*, it can be seen that the lateral etching amount is approximately 0.1 μm. As described above, in the second embodiment, not only the presence or absence of lateral etching at the time of etching of the mesa is determined, but also the approximate degree of the lateral etching can be evaluated without measuring the diameter of the mesa.

Figure 9:
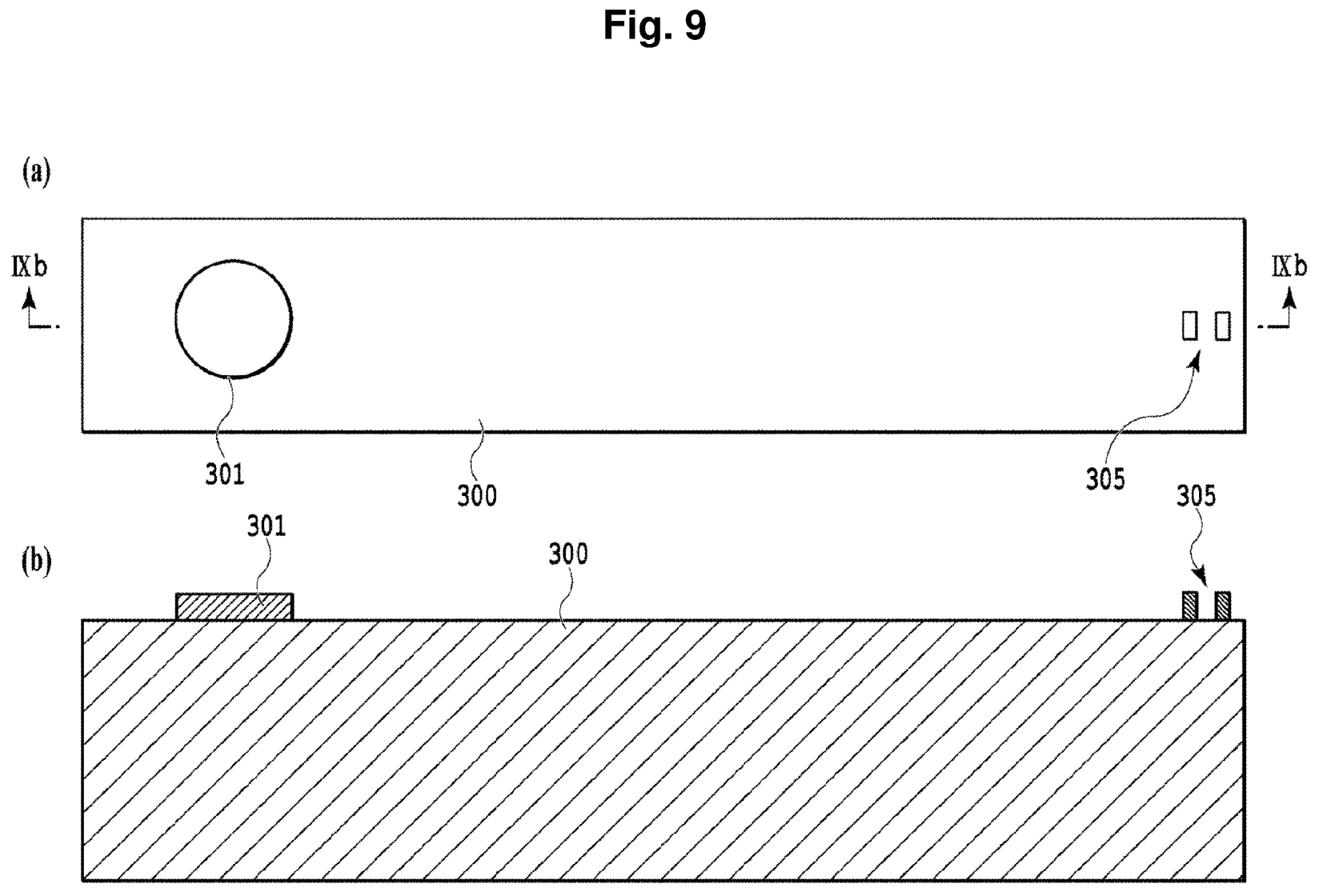
Figure 10:
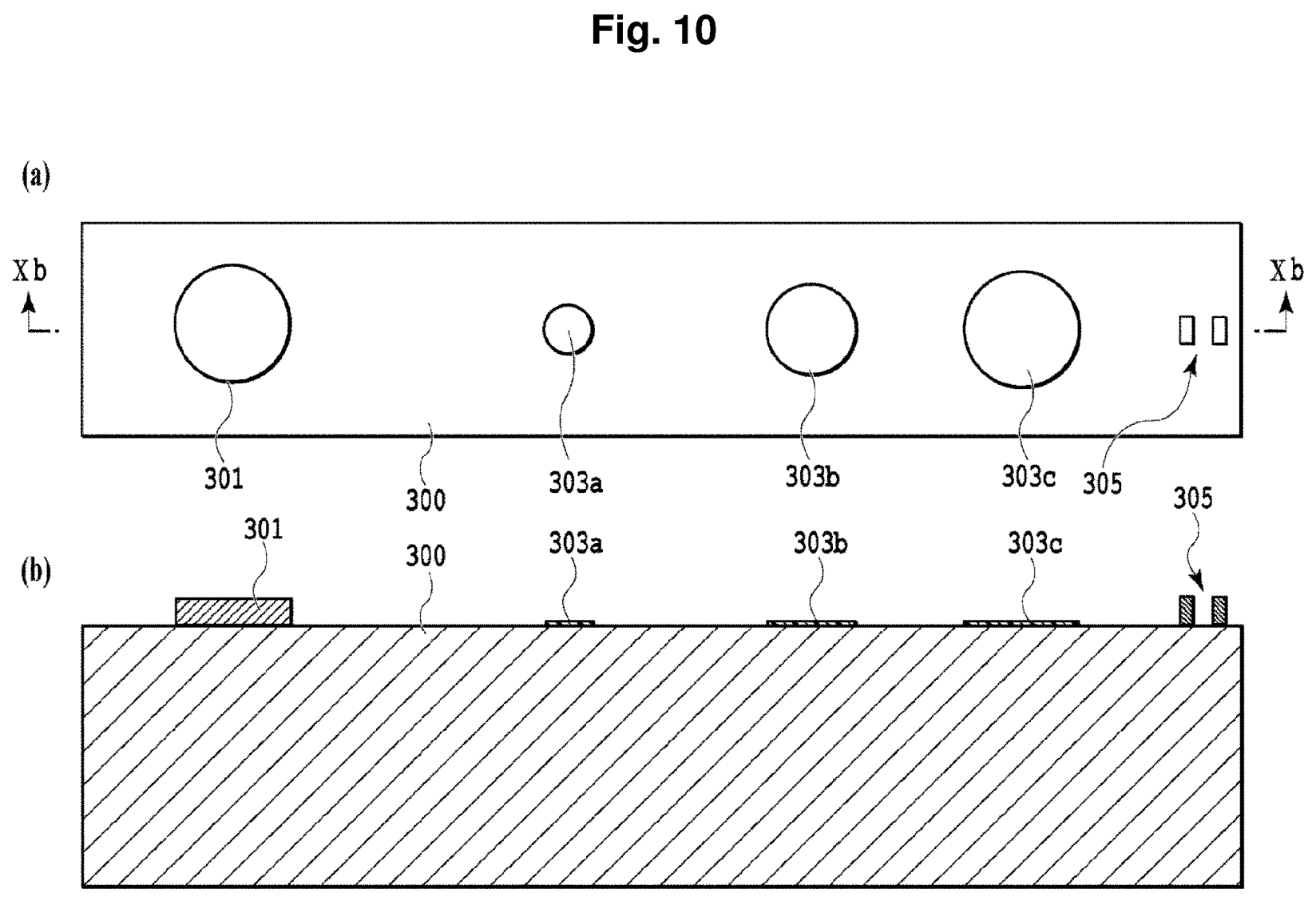

Next, a method of manufacturing an inspection pattern according to the second embodiment will be described. FIG. 9(*a*) to FIG. 13(*b*) are views for explaining a method of manufacturing the inspection pattern T of the second embodiment. Among these, FIG. 9(*a*), FIG. 10(*a*), FIG. 11(*a*), and FIG. 12(*a*) are schematic top views of the chip during manufacturing, and FIG. 9(*b*), FIG. 10(*b*), FIG. 11(*b*), and FIG. 12(*b*) are cross-sectional views each taken along a cutting-plane line of a corresponding top view. In the second embodiment, as illustrated in FIG. 9(*a*) and FIG. 9(*b*), the electrode 301 and an alignment mark 305 are formed on the substrate 300 as with the first embodiment. Then, as illustrated in FIG. 10(*a*) and FIG. 10(*b*), thin films 303*a*, 303*b*, and 303*c* having the same shapes and different sizes (diameters) are formed at predetermined positions different from the formation position of the electrode 301. The thin films 303*a*, 303*b*, and 303*c* of the second embodiment are SiN films formed by plasma CVD as with the first embodiment.

Figure 11:
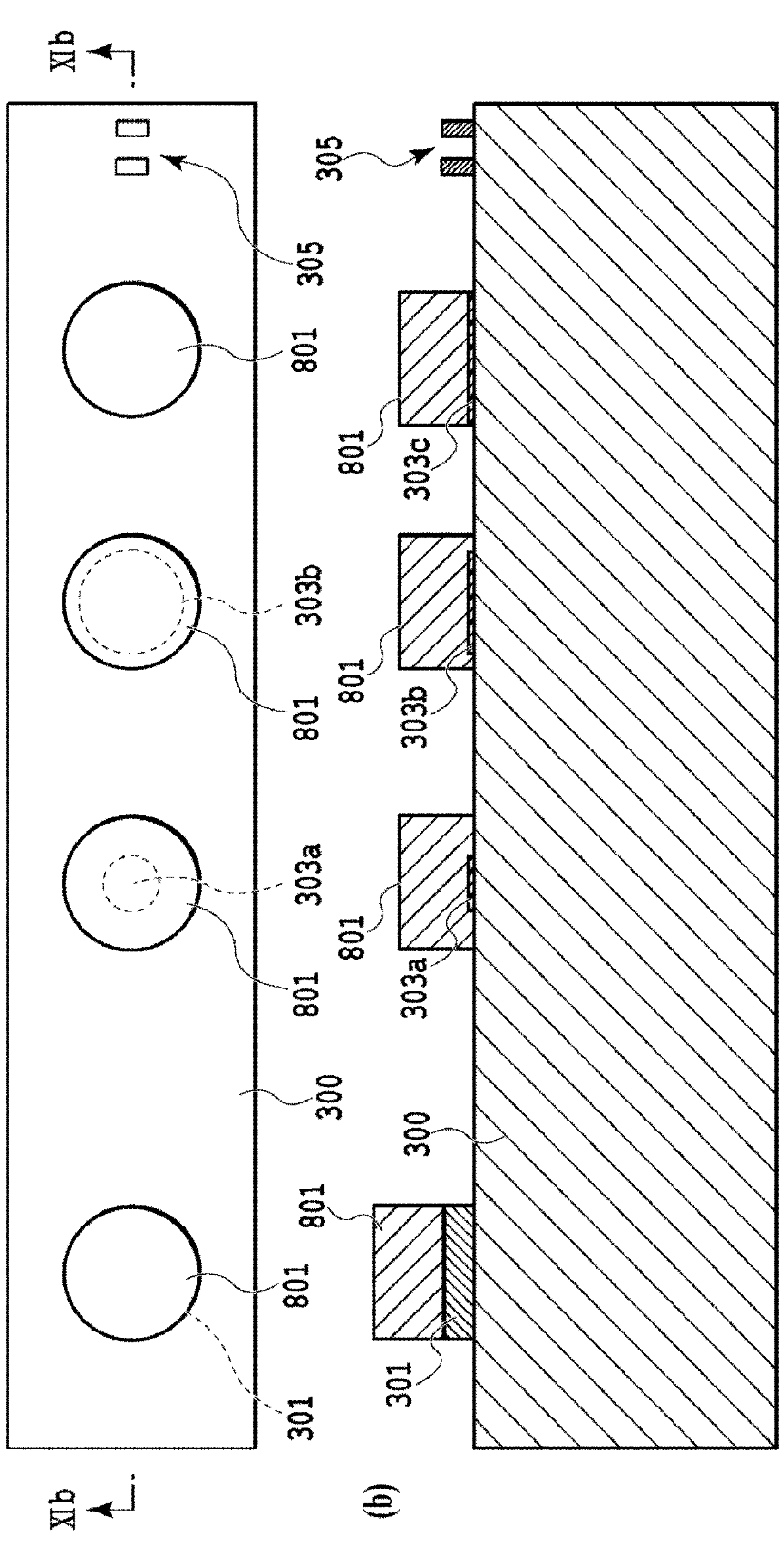
FIG. 11(*a*) is a top view for explaining the method of manufacturing an inspection pattern according to the second embodiment subsequent to FIG. 10(*a*), and FIG. 11(*b*) is a cross-sectional view subsequent to FIG. 10(*b*).
Figure 12:
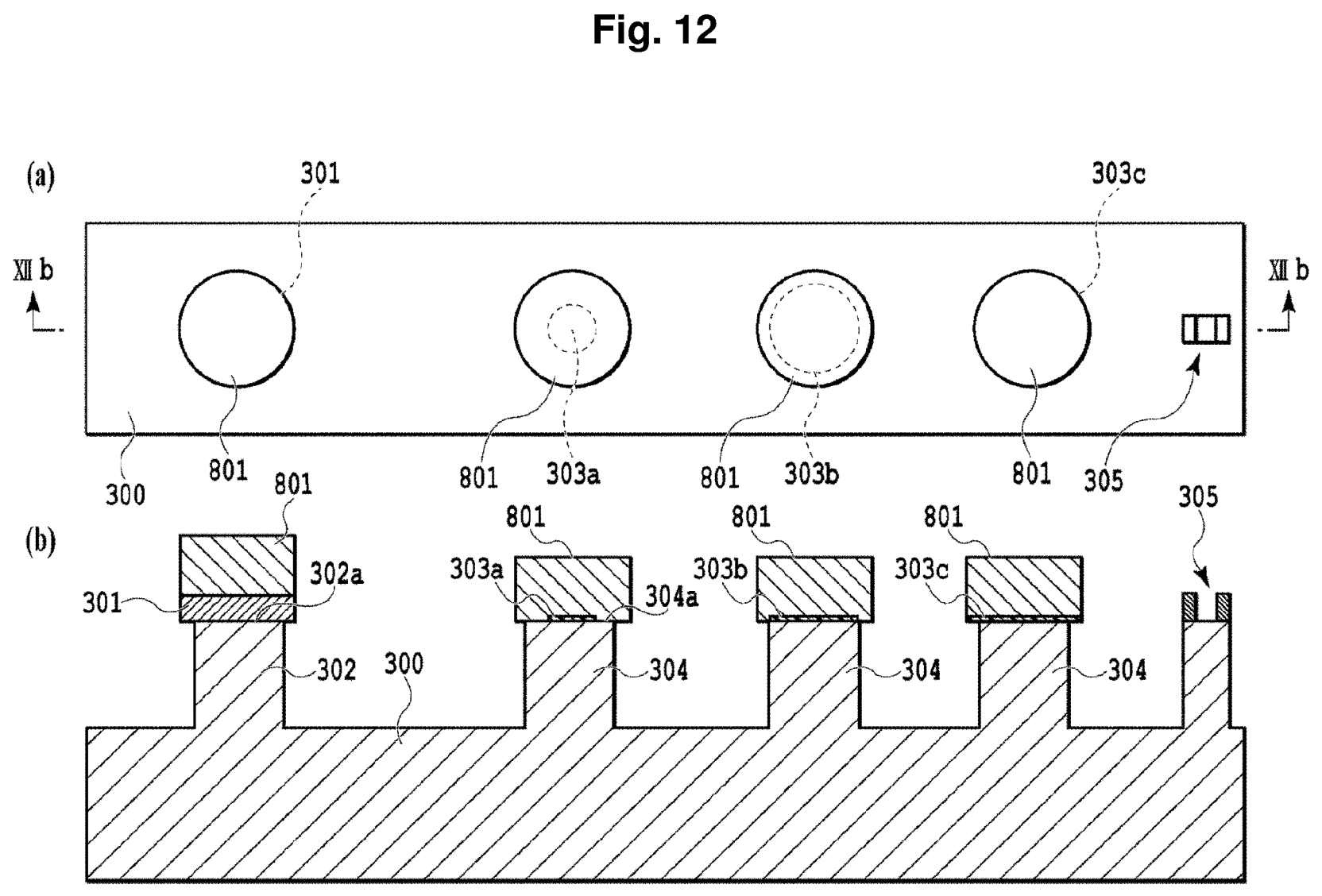

Next, in the second embodiment, a resist mask 801 is formed from above the electrode 301 by known photolithography as illustrated in FIG. 11(*a*) and FIG. 11(*b*). Moreover, a resist mask 801 having the same diameter as the resist mask 801 on the electrode 301 is formed on each of the thin films 303*a*, 303*b*, and 303*c*. Next, in the second embodiment, the substrate 300 is etched using the resist masks 801 as masks to form the mesas 302 and 304. FIG. 12(*a*) and FIG. 12(*b*) illustrate a state after etching of the substrate 300 and before peeling of the resist masks 801. As can be seen from FIG. 12(*a*) and FIG. 12(*b*), the mesas 302 and 304 are smaller in diameter than the resist masks 801, and lateral etching occurs at the time of etching. Moreover, although the diameters of the mesas 304 are the same, the diameters of the thin films 303*a*, 303*b*, and 303*c* on the upper surface 304*a* are different, and evaluation can be performed without measuring the approximate degree of lateral etching by comparing edges of the thin films 303*a*, 303*b*, and 303*c* with edges of the upper surface 304*a*.

Figure 13:
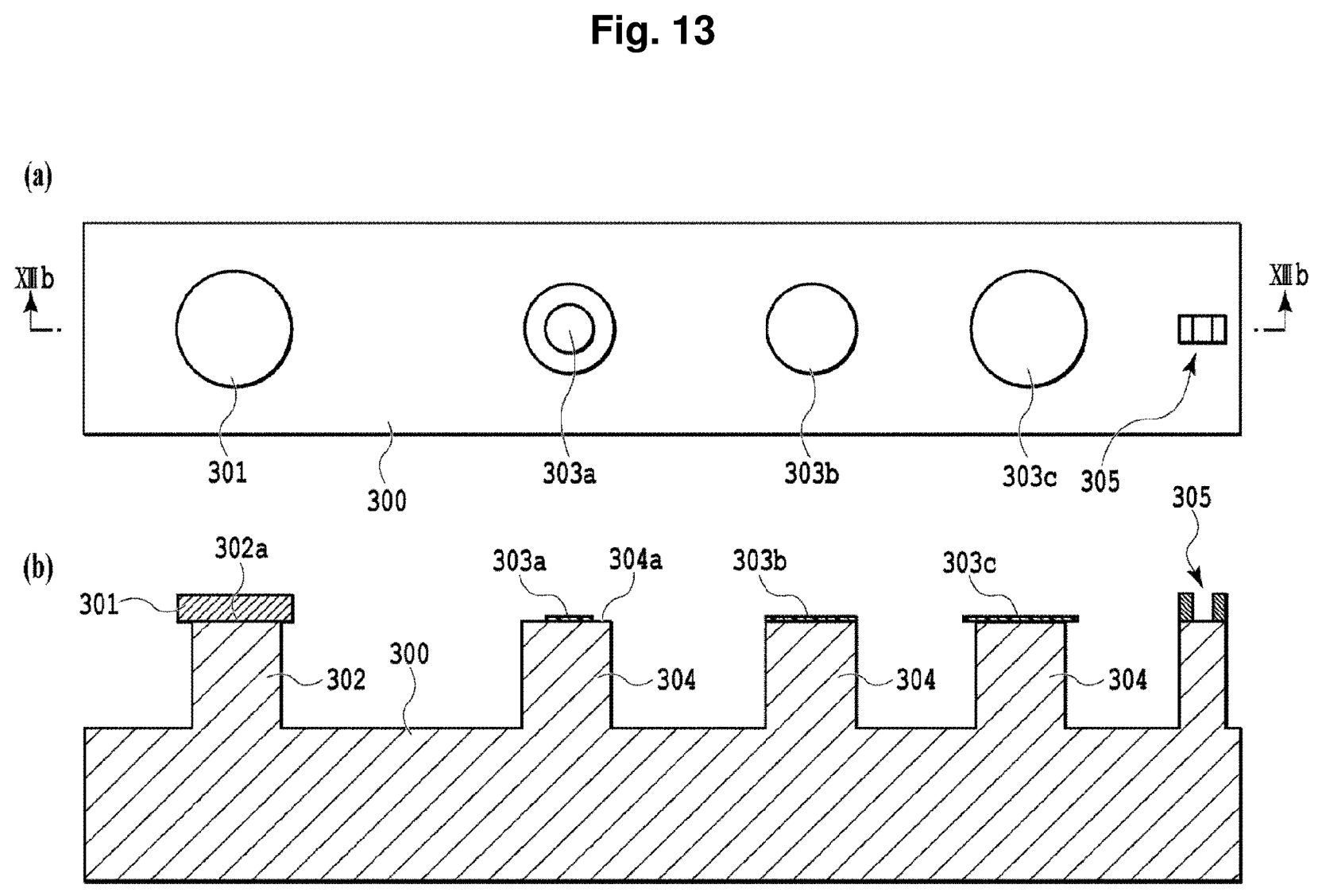

FIG. 13(*a*) and FIG. 13(*b*) illustrate a state in which the resist masks 801 are peeled off from the inspection pattern and the actual pattern in the state illustrated in FIG. 12(*a*) and FIG. 12(*b*). Note that the resist masks 801 are peeled off using, for example, acetone-ethanol.

Note that, although the first embodiment and the second embodiment of the present disclosure described above illustrate examples in which the shapes of the mesa and the thin film in a top view are circular, the shapes of the mesa and the thin film in a top view are not limited to circular shapes, and may be elliptical shapes, quadrangular shapes such as rectangular shapes or square shapes, or the like, and it is obvious that the shapes can be any shape according to the original purpose of the actual element itself.

REFERENCE SIGNS LIST

200, 300 Substrate
201, 301 Electrode
202, 204, 302, 304 Mesa
202*a*, 204*a*, 302*a*, 304*a* Upper surface
203, 303*a*, 303*b*, 303*c* Thin film
203*a*, 303*c*, a Peripheral portion
205, 305 Alignment mark
801 Resist mask
M Actual element
T Inspection pattern
H Observation hole

The invention claimed is:

1. An inspection patterns for inspecting a processing state of a pattern used for an actual element, wherein the actual element includes an actual pattern portion formed by etching a substrate, and an actual upper layer portion formed on the actual pattern portion, the inspection pattern includes:

an inspection pattern portion formed by etching the substrate; and an inspection layer portion that is formed at least on the inspection pattern portion and has a thickness smaller than a thickness of the actual upper layer portion, and an etching state of the actual pattern portion is evaluated on a basis of a difference between a shape of the inspection pattern portion and a shape of the inspection layer portion.

2. The inspection patterns according to claim 1, wherein the inspection layer portion has a shape based on a designed value of the actual pattern portion.

3. The inspection patterns according to claim 1, wherein a plurality of the inspection patterns is provided on the substrate, and at least some of the plurality of inspection patterns include similar inspection layer portions having same shapes and different sizes.

4. The inspection patterns according to claim 1, wherein the actual upper layer portion is an electrode for supplying electric power (utilizing electrical components) to the actual pattern portion.

5. The inspection patterns according to claim 1, wherein the inspection layer portion includes a film made of an inorganic material.

6. A pattern evaluation method for evaluating (monitoring) a processing (fabricating) state of an actual element including an actual pattern portion formed by etching a substrate, and an actual upper layer portion formed on the actual pattern portion, the method comprising:

a step of manufacturing an inspection pattern including an inspection pattern portion formed by etching the substrate and an inspection layer portion that is formed at least on the inspection pattern portion and has a thickness smaller than a thickness of the actual upper layer portion; and a step of observing the inspection pattern portion and the inspection layer portion from a side of the inspection layer portion, and evaluating an etching state of the actual pattern portion on a basis of a difference between a shape of the inspection pattern portion and a shape of the inspection layer portion.

7. The pattern evaluation method according to claim 6, wherein the step of evaluating an etching state of the actual pattern portion is performed in a state where at least the inspection pattern is exposed.

* * * * *